United States Patent [19]

Cosmo

[11] Patent Number: 4,593,961
[45] Date of Patent: Jun. 10, 1986

[54] ELECTRICAL COMPRESSION CONNECTOR

[75] Inventor: Nicola Cosmo, Harrisburg, Pa.

[73] Assignee: AMP Incorporated, Harrisburg, Pa.

[21] Appl. No.: 683,849

[22] Filed: Dec. 20, 1984

[51] Int. Cl.⁴ .............................................. H01R 9/09
[52] U.S. Cl. .............................. 339/61 M; 339/17 CF; 339/17 M; 339/75 MP; 339/DIG. 3
[58] Field of Search ........... 339/DIG. 3, 59 M, 61 M, 339/17 M, 17 LM, 75 MP, 17 CF, 75 M

[56] References Cited

U.S. PATENT DOCUMENTS

| | | | |
|---|---|---|---|
| 3,526,869 | 9/1970 | Conrad et al. | 339/75 MP |
| 3,795,037 | 3/1974 | Luttmer | 339/61 M |
| 3,852,878 | 12/1974 | Munro | 339/17 LM |
| 4,003,621 | 1/1977 | Lamp | 339/DIG. 3 |
| 4,344,662 | 8/1982 | Dalamangas et al. | 339/DIG. 3 |
| 4,437,718 | 3/1984 | Selinko | 339/DIG. 3 |
| 4,509,099 | 4/1985 | Takamatsu | 339/61 M |

OTHER PUBLICATIONS

"Electronics"; May 3, 1984; pp. 134–136.

Primary Examiner—John McQuade
Attorney, Agent, or Firm—Adrian J. LaRue

[57] ABSTRACT

An interconnector device for electrical conductors and compression assemblies therefor has a plurality of rigid electrically conductive rods, each rod being imbedded in a fixed cross-sectional plane of a dielectric, compressible core and projecting therefrom, whereupon application of an orthogonal compressive force will cause the rods to rotate relative to the core thereby causing the ends of the rods to move along two non-coincident lines of action to establish wiping electrical connection with the conductors.

18 Claims, 11 Drawing Figures

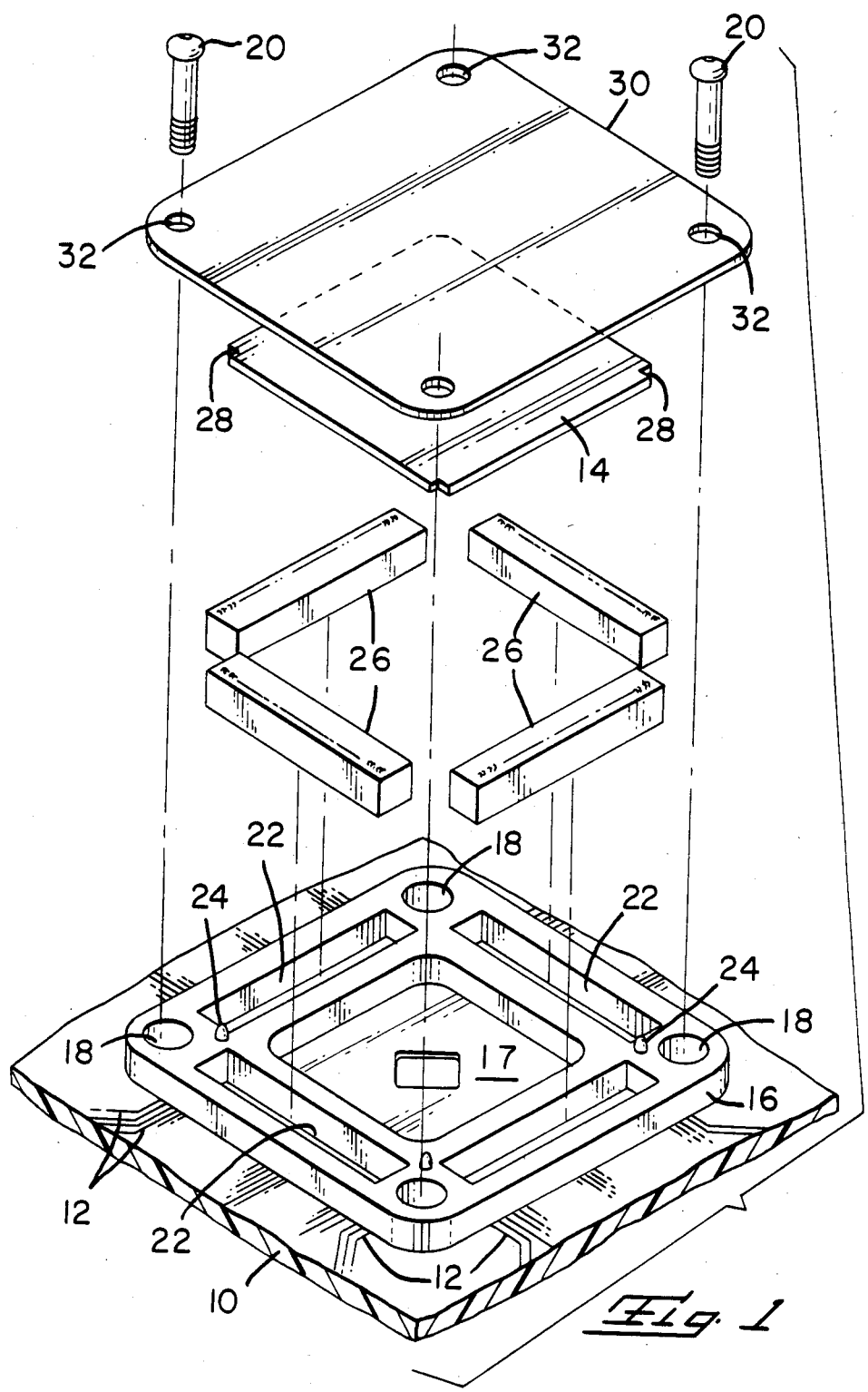

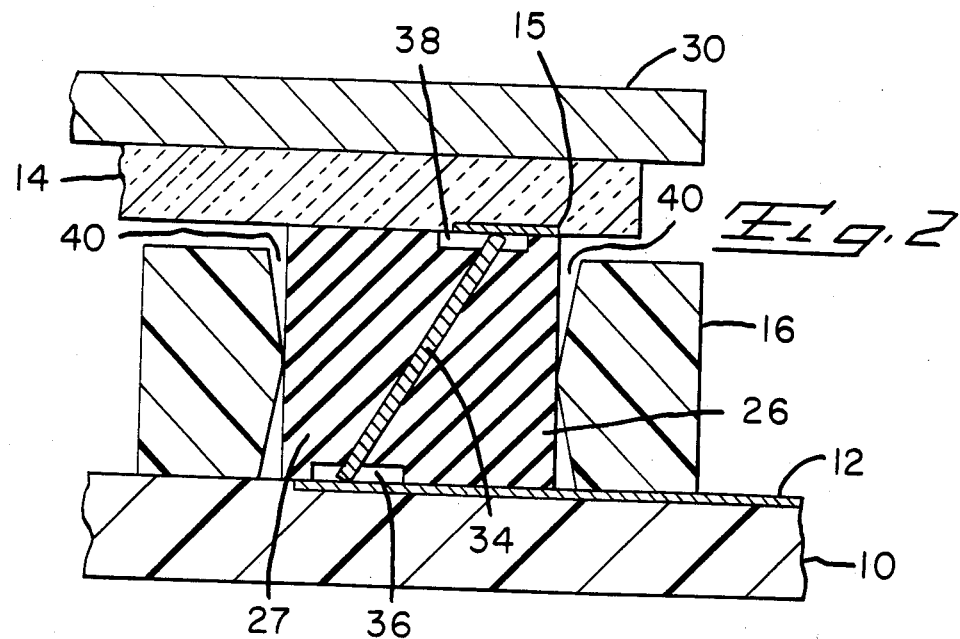
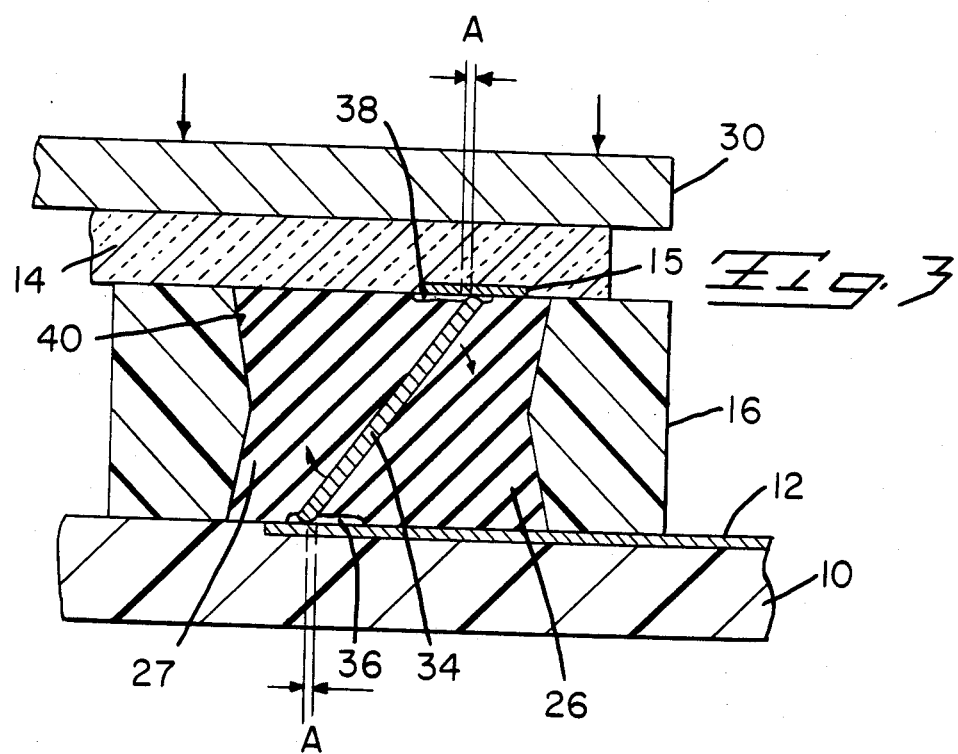

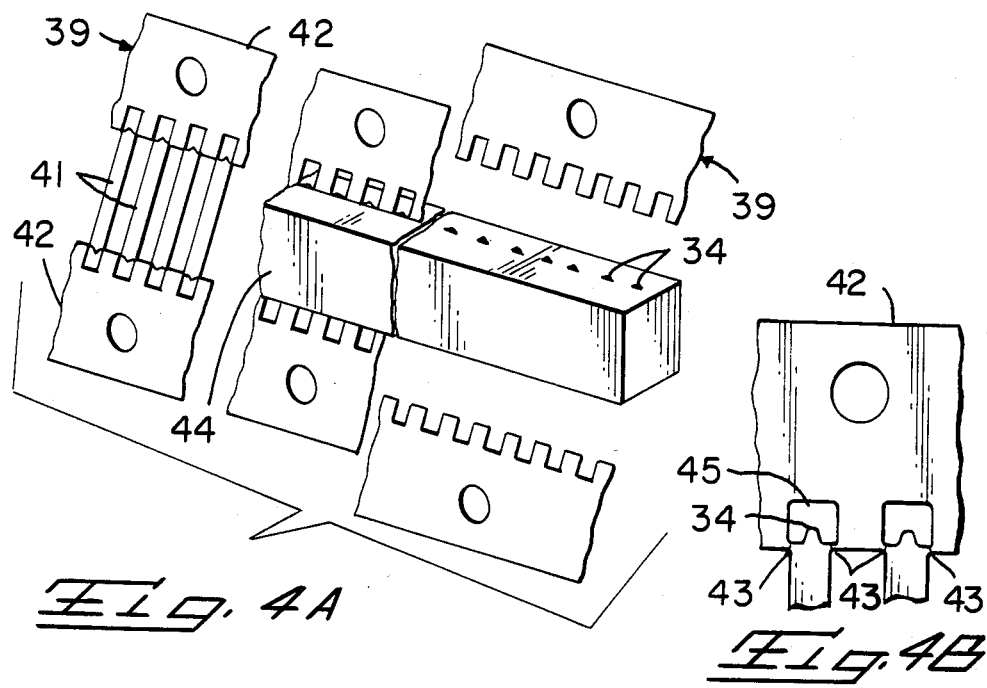
Fig. 4A
Fig. 4B
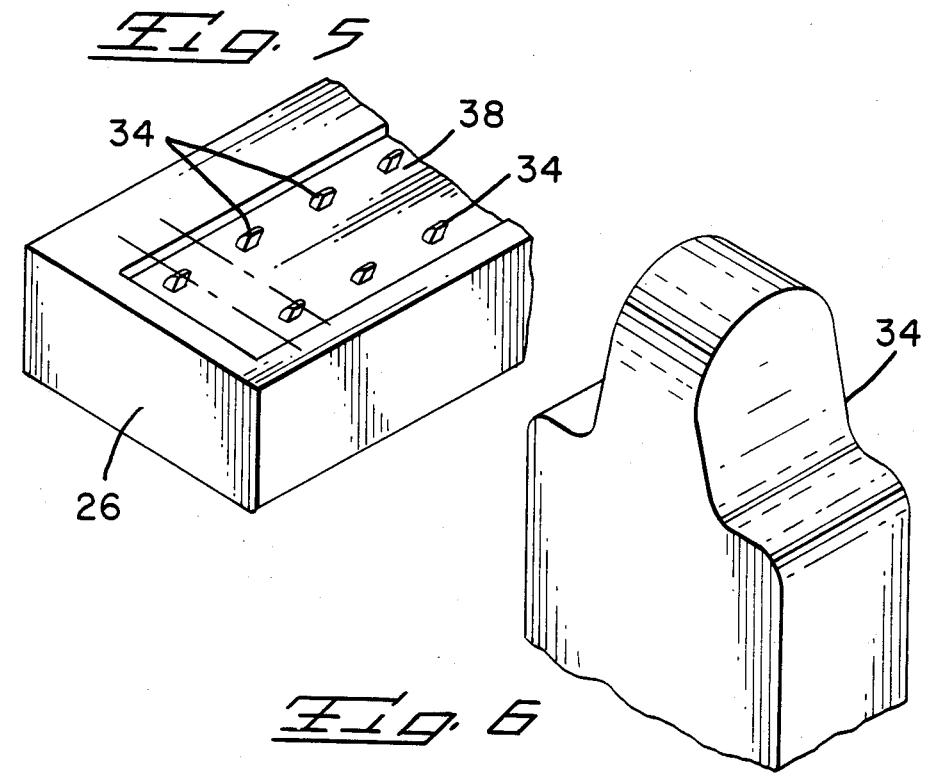
Fig. 5
Fig. 6

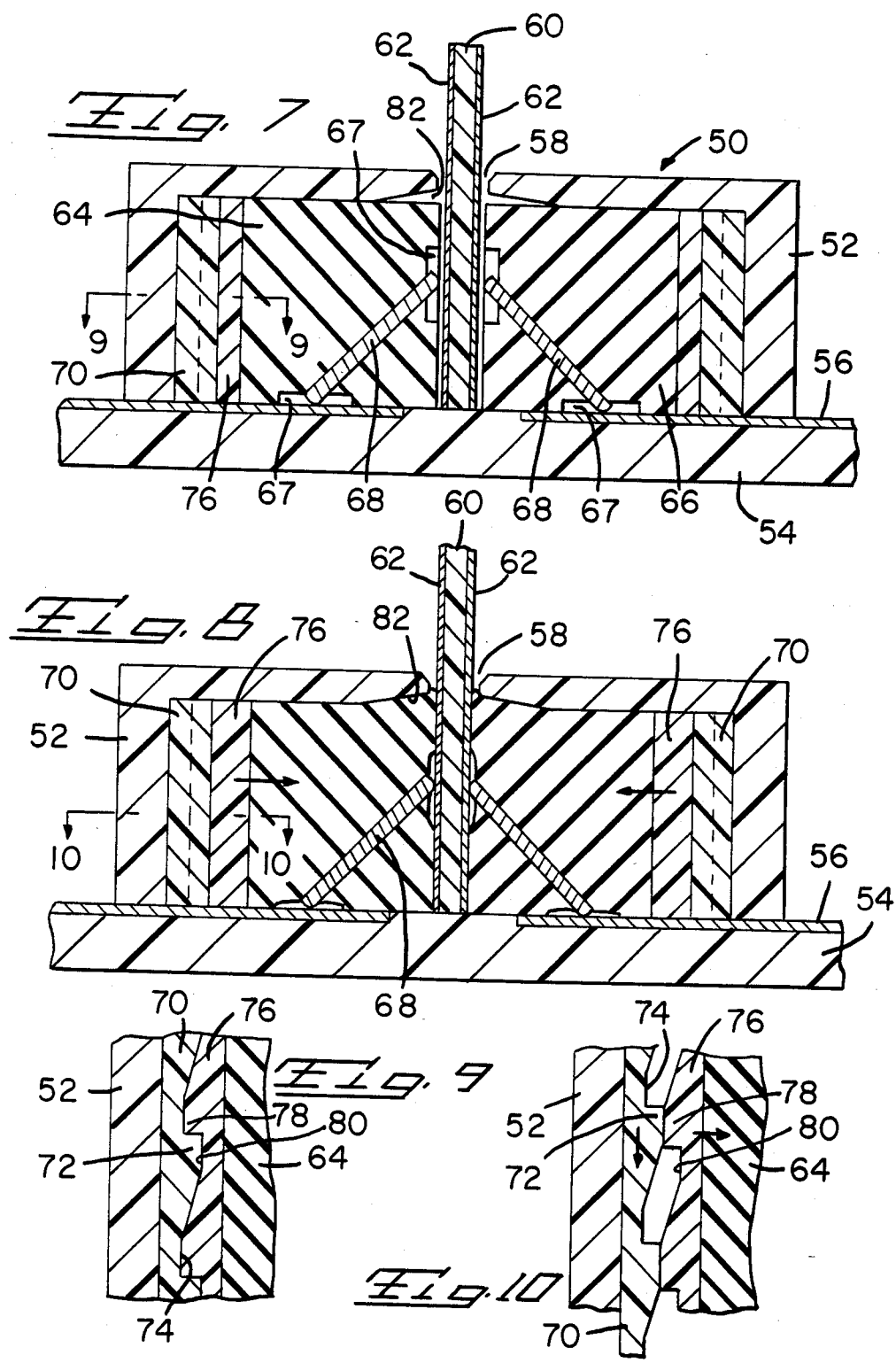

ELECTRICAL COMPRESSION CONNECTOR

TECHNICAL FIELD

This invention relates to compression devices providing a number of interconnections between two surfaces containing a plurality of electrical traces. More particularly, this invention provides a straight-beam connector having electrically conductive rods secured within a compressible elastomeric core which in turn is contained within a housing for holding and maintaining the rods in the same cross-sectional plane relative to the core and for interconnecting two sets of electrical traces on such as PC boards or digital displays.

BACKGROUND OF THE INVENTION

Applications for smaller, more sophisticated components in the electronics industry have generated a corresponding demand for reliable, miniaturized connectors. For example, the advent of the electronic calculator, digital watch and personal computer has transported the requirements for devices from the realm of specialization to virtually one of commodity status.

Many types of connectors have been devised for interconnecting circuit boards to each other or computer chips. Exemplary of more recent developments are the connectors illustrated in U.S. Pat. No. 4,295,700 and ELECTRONICS, May 3, 1984, pages 135 to 136. Sado, U.S. Pat. No. 4,295,700, relates to a layered elastomeric based press contact interconnector employing a thin sheet of alternating dielectric and electrically conductive elastomeric layers sandwiched within an insulative housing in a manner where the peripheral portions along the edge lines perpendicular to the direction of anisotropical electroconductivity extend beyond the housing. Furthermore, the angle at which the peripheral portions project beyond the surface(s) of the housing is less than 80 degrees and more than 10 degrees relative thereto.

The ELECTRONICS article features a new Textronix, Inc. compression contact connector for interconnecting a 132-pin leadless chip carrier and a printed circuit board. The connector employs four elastomer devices, each disposed within a corresponding cavity in a square housing frame which is adapted to seat on a circuit board. The frame is secured to the circuit board by screws passing through an upper pressure plate, the frame and the board and then into an underlying stiffener frame. The chip carrier is lodged between the frame and pressure plate and is electrically connected to the board via elastomer devices upon compression of the pressure plate relative to the board upon tightening the screws.

The aforementioned connectors provide various desirable aspects for a connector such as wiping electrical contact, fixed interconnection using elastomeric connectors, reduced compressive load requirements, prevention of distortion of the interconnectors conductive pathways, capacity to rebound from the compressed to uncompressed state, minimization of contact resistance and an environmental seal against deleterious moisture and pollutants.

However, not all of these desirable features are found in any one particular connector. Moreover, the prior art connectors do not provide electrically conductive pathways which maximize efficiency, i.e. minimize path length and electrical resistance. Also, elastomeric connectors often fail to rebound completely upon release of compressive force therefore causing the connector to fail upon repeated compression and release.

SUMMARY OF THE INVENTION

The primary object of this invention is to provide the desirable features of known devices as well as overcoming the noted deficiencies thereof.

It is another object of this invention to provide a connecting device maximizing electrical contact efficiency by providing a wiping contact between two electrical conductors and a minimum conductive pathway length.

A further object of this invention is to provide a connecting device possessing outstanding mechanical rebound characteristics thereby permitting repeated compression and release.

These and other objects are satisfied by a device including an elongated, dielectric elastomeric core composed of a yieldable, compressible elastomer. The core secures a plurality of spaced, discrete electrically conductive and rigid rods, each disposed in a different cross-sectional plane of the core. Each rod has a first and a second end, each projecting beyond a different boundary of the core other than at right angles relative thereto. By this arrangement, the rods are capable of rotating in the cross-sectional plane of said core when a compressive force is applied to the connector and therefore to the two ends of the rods. Upon application of a compressive force orthogonally directed relative to the device, the ends of the rods move along two noncoincident lines of action relative to the core as the rod rotates relative to the core.

When the connector assembly is employed, as for example, between two circuit boards disposed in parallel, each including a plurality of traces, electrical interconnection between corresponding traces is established through the rods. Compressing and holding the connector in a compressed state causes the rods to rotate relative to the supporting core thereby generating movement of the ends of the rods which wipe along the corresponding electrical traces. Thus, the interposed connector assembly secures the two conductors in a relatively fixed position, insures a wiping electrical contact to reduce contact resistance between each of the conductors and the connective device and simultaneously provides a minimal length, conductive pathway therebetween. Furthermore, in certain preferred embodiments, the device provides an environmental seal around the connections.

Other preferred embodiments, and modifications of this invention such as a zero insertion force connector for perpendicularly disposed conductors which is described in greater detail below, will become obvious to the skilled artisan upon review of the following disclosure.

BRIEF DESCRIPTION OF THE DRAWINGS

FIG. 1 is an exploded perspective view of the preferred embodiment of the invention.

FIG. 2 is a cross-sectional side view of one portion of the invention.

FIG. 3 is an identical view of FIG. 2 as compressive force is applied.

FIGS. 4A and 4B are perspective representative views of the manufacture of the connective device.

FIG. 5 is a partial perspective view of the connective contact strip in its carrier frame.

FIG. 6 is a part perspective view of one end of cross conductive rod.

FIGS. 7 and 8 are schematic cutaway side views of a zero insertion force connector card used in an alternative embodiment of the invention.

FIGS. 9 and 10 are exaggerated top views of the camming mechanism employed in FIGS. 7 and 8.

DETAILED DESCRIPTION OF THE PREFERRED EMBODIMENT

As illustrated in FIG. 1, a preferred embodiment of this invention provides electrical connection between a chip (not depicted), lodged in chip carrier 14 and a circuit board 10 which are disposed in parallel. Circuit board 10 has a number of electrically conductive traces 12. To secure board 10 to the chip lodged in the ceramic carrier 14 and effect electrical connection therebetween, it is necessary to establish electrical contact between the chip and the various traces 12. Contact is established using a compression contact assembly of this invention.

The assembly includes a four-sided, square, mounting frame 16 enabling contact in two dimensions between carrier 14 and board 12. Frame 16 is characterized by the following features: thickness relatively lesser than its length and width, four apertures 18 through which mounting screws 20 pass to secure the assembly to board 10, elongated rectangular cavities 22 disposed proximate to the sides of and extending through the thickness of frame 16, central orifice 17 which underlies all but the periphery of carrier 14, and lastly, three positioning lugs 24 projecting above the upper surface of frame 16 in the corners thereof near apertures 18 and the ends of cavities 22.

Contact devices 26 are located within cavities 22 to enable electrical contact between traces 12 and the chip along a minimal conductive pathway. Ceramic chip carrier 14 features a chip of any conventional type, a series of electrical traces capable of establishing electrical contact with contact devices 26 and three notches 28 which slidably engage positioning lugs 24 thereby preventing lateral or rotational movement between chip carrier 14 and frame 16.

Pressure plate 30 overlies chip carrier 14 and has holes 32 in each corner in a corresponding position to apertures 18 of frame 16. Holes 32 are adapted for insertion of the threaded portions of screws 20 but are of insufficient diameter to allow the heads of screw 20 to pass therethrough. Upon tightening of screws 20 when positioned in holes 32, through apertures 18 and into or through board 10, the lower surface of pressure plate 30 is compressed against the upper surface of chip carrier 14. Any conventional tightening means may be employed to generate the requisite compressive force such as underlying nuts, stiffener frame, or merely lodging the threaded portion of screws 20 within board 10. The periphery of lower surface of carrier 14, extending beyond the limits of orifice 17, is compressed into an abutting relationship with the upper surface of contact devices 26 and the upper surface of frame 16. By such compression notches 28 are brought into abutment with positioning lugs 24. The length of positioning lugs 24 cannot exceed the thickness of chip carrier 14 in order to achieve the compressed relationship identified above. Further establishment of a compression contact between carrier 14 and the upper surface of devices 26, also establishes a compressed relationship between board 10 and the lower surfaces of both frame 16 and contact devices 26. Thus, electrical contact between rows of conductive traces 12 and chip 14 is established via contact device 26.

Referring now to FIG. 2, the connector assembly is depicted in its uncompressed mode. The positions of board 10, frame 16, contact device 26, chip carrier 14 and pressure plate 30 are more clearly presented in a manner to highlight features not described above. Most particularly, the structure of contact device 26, a critical aspect of this invention, is revealed.

Contact device 26 includes a generally elongated, rectangular, dielectric elastomeric core 27 in which rigid electrically conductive linear rod members 34 are imbedded. The cross-sectional height of core 27 is slightly greater than that of frame 16. Therefore, the upper surface of core 27 projects above cavity 22. Both the upper and lower faces of elastomeric core 27 feature elongated shallow recesses 36 and 38 through which the lower and upper ends of rod 34 project, respectively. Grooves or recesses 36 and 38 are offset relative to the cross-sectional plane of connector 26, the importance of which is explained below. Additionally, the illustrated arrangement of recesses 36 and 38, upon compression, provide rod 34 with an environmental seal from deleterious atmospheric pollutants and moisture.

The upper end of rod 34 is illustrated in uncompressed abutment with chip carrier trace 15, located on the lower surface of carrier 14, and the lower end of rod 34 likewise is in contact with trace 12 on board 10. Rod 34 passes through elastomeric core 27 at an angle greater than 45 degrees but less than 90 degrees, and preferably about 60 degrees, relative to the upper and lower faces of connector 26. It is further contemplated that the length and angle of rod 34 will be such that its uppermost point projecting above recess 38 lies in the plane formed by the upper face of connector 26. Similarly, the lower end of rod 34 projects below recess 36 and at its lowermost point is flush with the lower face of connector 26. Also featured along the interior walls of frame 16 are bevels 40 providing space for displacement of elastomeric core 27 upon compression.

Although specific examples of and the properties of rod 34 and core 27 are discussed below, for the purpose of understanding FIGS. 2 and 3, it is sufficient to note that the elastomer used in formulating core 27 is compressible and that rods 34 are rigid. The rigidity of rods 34 imparts greater mating force thereof with traces 12 and 15 thereby assuring maximum wiping contact and electrical transmission.

Turning now to FIG. 3, the assembly is illustrated after pressure plate 30 has been secured to board 10, compressing the various components in the direction of the arrows. The preferred degree of compressive force is sufficient to bring the lower surface of chip carrier 14 into abutment with frame 16. Therefore, elastomeric core 27 is compressed to a height substantially equivalent to frame 16. As noted above, bevels 40 facilitate compression of core 27 by permitting displacement of compressed material to expand therein.

Rod 34 first contacts traces 15 and 12 at its upper and lower ends, respectively, and forms a camming relationship therewith. Angled rod 34, upon compression, produces a twisting force or torque in core 27, thereby rotating within core 27 to a distance proportional to the distance of compression. Due to this rotation and the camming engagement of the upper and lower ends of rod 34 with traces 15 and 12, respectively, the ends of rod 34 move linearly along the traces (represented by distance A) in noncoincident lines relative to core 27. This linear movement, the degree of which is proportional to the degree of compression, produces a wiping contact between connective rod 34 and traces 12 and 15. It is well known that a wiping contact insures reliable electrical contact between two discrete conductive members by abrading and wiping the oxidation layers from the two abutting surfaces. Elimination of the oxidation layers accordingly reduces contact interface resistance. Therefore, this invention, upon compression, provides such contact between two remote traces while also providing a connective pathway of minimal length therebetween.

In order to achieve a multiplicity of electrically connective pathways through a single device 26, aspects of manufacturing are now addressed. FIG. 4 represents a systemation or method for a connector manufacturing process. The ideal elastomer used for core 27 is dielectric, compressible, and has sufficient tensile strength to secure rods 34 as described above. Furthermore, the elastomer should rebound isotropically to return to its uncompressed dimensions upon release of compressive force.

Silicon elastomer such as Silastic GP-45 made by Dow Corning provides a dielectric elastomeric material quite suitable for the purpose of this invention. It has a low hardness and low tension set. These properties make for ease of compression as well as adequate resiliency to permit rebounding of core 27 and rods 34 substantially to their original uncompressed positions following release of compressive forces. In FIG. 4A, contact strip 39 is illustrated as comprising a plurality of tines 41 extending between base sections 42. Contact strip 39 is clamped in a conventional precision molding apparatus (not depicted) and silicone elastomer is injected into a precision mold which, notably, is smaller than contact strip 39. Therefore, elongated elastomeric block 44 is formed around only the central portion of tines 41. Tines 41 are orthogonally disposed relative to the direction of elongation of block 44 but pass through and out of the upper and lower surfaces of block 44 at an acute angle. When, as in the preferred embodiment, the cross section of block 44 is square, this angle is preferably between 50 degrees and 85 degrees and more preferably 60 degrees.

Once molded, contact strip 39 is severed from block 44 by cutting tines 41 in a manner to produce convex surfaces on both the upper and lower ends (see FIGS. 5 and 6). Rods 34, resulting therefrom, possess convex surfaces which facilitate a smooth camming relationship between rods 34 and traces 12 and 15 to provide suitable wiping contact therebetween without damage to the traces. FIG. 4B is an enlarged view of a portion of FIG. 4A which more clearly shows how the tines 41 are attached to the base sections 42. More precisely, when the contact strip 39 is severed from block 44, cutout portions 43 which are contained in a cutout region shown generally at 45 are severed. The cutout region 45 is preferably used since the ends of the rods 34 can be precisely formed prior to severing and not as a result of it. In this manner, the ends of the rods 34 may be more easily and accurately shaped for maximum contact effectiveness. This cutout region 45 is preferably formed in the same manner as the entire contact strip 39 and may be from a stamping operation or etched. As illustrated in FIG. 5, a particular connector 26 may include two or even more rows of rods 34 if desired. When multiple rows of rods 34 are included, each is offset along the direction of elongation of block 44 in order not to overly complicate the molding process or overly stress the elastomer. This offset feature further provides the alternative of increasing the number of contact points in a single connector 26 and may even be engineered to provide redundant contacts to the same electrical traces.

It may be desirable to facilitate production by stamping or scoring contact strips 38 prior to molding to produce the double-curve configuration illustrated in FIG. 6. Moreover, prefabricated breaking points generate substantially identical rods 34 imbedded in and projecting from block 44.

FIGS. 7 to 10 illustrate an alternative embodiment of this invention providing a zero insertion force edge connector for perpendicularly disposed electrical traces. In this case a vertical daughter board having traces on both sides is illustrated. Connector assembly 50 including housing 52, composed of a dielectric material such as polyethylene, is attached to circuit board 54 containing on its upper surface traces 56. Housing 52 is provided with elongated slot 58 in its upper surface which slot is of sufficient length and width to permit daughter board 60, having electrical traces 62 disposed on both surfaces, to be inserted therethrough.

Housing 52 contains two elongated elastomeric devices 64 positioned to provide isometrically mirror images of each other. Connectors 64 have a square cross-sectional configuration and are disposed in parallel within housing 52 leaving an open space under slot 58 coextensive with the height of housing 52 and substantially equal in length and width to slot 58. Like devices 26, described above, devices 64 are each composed of a compressible, resilient, dielectric, silicone elastomer core 66 having electrically conductive rods 68 imbedded therein. A further similarity between devices 26 and 64 is found in the elongated recesses 67 into which the ends of rods 68 project. Once again, these recesses provide for an environmental seal for the electrical connections between rods 68 and traces 56 and 62. Unlike the structure of devices 26, rods 68 extend through core 66 at an acute angle relative to the lower surface of core 66 in a manner to project from the side, not the upper surface, of core 66. Preferably, to establish satisfactory wiping contact between rods 68 and traces 56 and 62, the ends of rods 68 are convex as are rods 34, but unlike rods 34, are disposed at an angle of less than 50 degrees within core 66 relative to its lower surface.

Connector assembly 50 is depicted in FIG. 8 in its compressed electrical connective state. In order to more fully comprehend the mechanism employed to achieve compression, FIGS. 9 and 10, top views of a horizontal cross section indicated in FIGS. 7 and 8 are examined. Sliding members 70 are disposed along the elongated, interior, vertical walls of housing 52. Sliding members 70 are characterized by teeth 72 and beveled recesses 74 (more clearly presented in FIG. 10). Affixed along the elongated vertical sides of devices 64 are camming members 76. Camming members 76 are geometrically complementary to members 70 having teeth 78 which register with recesses 74 and recesses 80 which register with teeth 72. The particular geometry of complementary members 70 and members 76, upon sliding perpendicular to the plane of the page in FIGS. 7 and 8, provides a camming relationship therebetween. Thus, by sliding member 70 a distance approximately equal to the length of a tooth, beveled recesses 74 and 80 slide past one another until the highest portion of teeth 72 and 78 are seated against each other. It is apparent from FIGS. 9 and 10, that upon establishing a cammed relationship, connector 64 is compressed within housing 52.

Returning now to FIGS. 7 and 8, the establishment of the cammed relationship is represented by the relative width of device 76. In order to insure uniform compression of connector 64, bevels 82 are provided near the upper surface of housing 52 for expansion of connectors 64 therein. Compression of devices 64 cause the end rods 68 to slide along and firmly abut traces 56 and 62. Thus, a wiping electrically connective relationship is established therebetween.

To summarize the functioning of connector assembly 50, housing 52 is secured to mother board 54 in a conductive manner, daughter board 60 is inserted in the slot 58 in housing 52 and appropriately seated. Sliding members 70 are then moved to lock with camming member 76 which, in turn, compresses connector core 66 thereby causing the ends of rods 68 to establish an electrically conductive, wiped, environmentally sealed relationship with traces 56 and 62.

I claim:

1. An electrical connector for electrically connecting first and second circuit members, each member having a surface including conductive means, comprising:
   a dielectric member of compressible elastomeric material;
   substantially rigid electrically-conductive linear rod members secured at spaced intervals in said dielectric member and extending through said dielectric member substantially normal to a longitudinal axis of said dielectric member; said rod members extending at an acute angle with respect to the surfaces of the circuit members when in electrical engagement therewith; and
   ends of said rod members extending outwardly from different surfaces of said dielectric member and electrically engageable with respective conductive means of the first and second circuit members upon said dielectric member being pressed against the surfaces of the circuit members in a direction to bring the ends of the rod members into electrical engagement with respective conductive means.

2. An electrical connector as claimed in claim 1, wherein said dielectric member has a rectangular configuration.

3. An electrical connector as claimed in claim 2, wherein the surfaces of said dielectric member from which the ends of said rod members extend are opposing surfaces.

4. An electrical connector as claimed in claim 2, wherein the surfaces of said dielectric member from which the ends of said rod members extend are adjacent surfaces.

5. An electrical connector as claimed in claim 2, wherein said dielectric member has recesses in the surfaces of said dielectric member in which the ends of said rod members are disposed.

6. An electrical connector as claimed in claim 5, wherein the outer surfaces of the ends of said rod members are coextensive with outer surfaces forming the recesses.

7. An electrical connector as claimed in claim 1, wherein said ends have a convex configuration.

8. An electrical connector as claimed in claim 1, wherein said rod members are disposed in said dielectric member in a plane extending along the length of said dielectric member.

9. An electrical connector assembly for electrically connecting first and second circuit members, each member having a surface including conductive means, comprising:
   housing means having an opening therein;
   a dielectric member of compressible elastomeric material disposed in said opening;
   substantially rigid electrically-conductive rod members secured at spaced intervals in said dielectric member and extending through said dielectric member substantially normal to a longitudinal axis of said dielectric member, said rod members extending at an acute angle with respect to the surfaces of the circuit members when in electrical engagement therewith;
   ends of said rod members extending outwardly form different surfaces of said dielectric member and electrically engageable with respective conductive means of the first and second members upon said dielectric member being pressed against the surfaces of the circuit members in a direction to bring the ends of the rod members into electrical engagement with the conductive means; and
   means provided by said housing means for accommodating part of said compressible dielectric member when the compressive force causes said dielectric member to be distorted from its original configuration.

10. An electrical connector as claimed in claim 9, wherein said accommodating means comprises at least one beveled surface along an inside surface of said housing means.

11. An electrical connector assembly as claimed in claim 9, wherein said accommodating means comprises beveled surfaces along opposing inside surfaces of said housing means.

12. An electrical connector assembly as claimed in claim 9, wherein actuating means is associated with said dielectric member for applying said compressive force in the direction of electrical engagement.

13. An electrical connector assembly as claimed in claim 12, wherein said actuating means comprises a sliding member and a camming member both having matable teeth and recesses.

14. An electrical connector assembly as claimed in claim 9, wherein said ends of said rod members extend outwardly from opposing surfaces of said dielectric member so that the ends electrically engage and interconnect the respective conductive means of parallel-disposed first and second members.

15. An electrical connector assembly as claimed in claim 9, wherein said ends of said rod members extend outwardly from adjacent surfaces of said dielectric member so that the ends electrically engage and interconnect the respective conductive means of perpendicularly-disposed first and second members.

16. An electrical connector assembly as claimed in claim 9, wherein the surfaces from which the ends of said rod members extend have recesses.

17. An electrical connector assembly as claimed in claim 9, wherein the ends have a convex configuration.

18. An electrical connector assembly as claimed in claim 9, wherein said opening of said housing and said dielectric member are rectangular.

* * * * *